US009624405B2

(12) United States Patent
Il et al.

(10) Patent No.: US 9,624,405 B2
(45) Date of Patent: Apr. 18, 2017

(54) OPTICAL LAMINATE BODY AND SURFACE LIGHT SOURCE DEVICE

(71) Applicant: ZEON CORPORATION, Tokyo (JP)

(72) Inventors: Yasunori Il, Tokyo (JP); Kenichi Harai, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 15/108,079

(22) PCT Filed: Dec. 18, 2014

(86) PCT No.: PCT/JP2014/083618
§ 371 (c)(1),
(2) Date: Jun. 24, 2016

(87) PCT Pub. No.: WO2015/098714
PCT Pub. Date: Jul. 2, 2015

(65) Prior Publication Data
US 2016/0326405 A1    Nov. 10, 2016

(30) Foreign Application Priority Data
Dec. 27, 2013   (JP) .................................. 2013-272620

(51) Int. Cl.
| H01L 51/52 | (2006.01) |
| C09J 7/02 | (2006.01) |
| C09J 133/14 | (2006.01) |
| F21S 2/00 | (2016.01) |
| H01L 51/50 | (2006.01) |
| B32B 7/12 | (2006.01) |
| B32B 27/08 | (2006.01) |
| B32B 27/22 | (2006.01) |
| B32B 27/30 | (2006.01) |
| C08K 3/22 | (2006.01) |
| C08K 3/40 | (2006.01) |
| C08K 5/101 | (2006.01) |
| C09J 133/08 | (2006.01) |

(52) U.S. Cl.
CPC .............. *C09J 7/0246* (2013.01); *B32B 7/12* (2013.01); *B32B 27/08* (2013.01); *B32B 27/22* (2013.01); *B32B 27/308* (2013.01); *C09J 133/14* (2013.01); *F21S 2/00* (2013.01); *H01L 51/50* (2013.01); *H01L 51/5275* (2013.01); *B32B 2307/418* (2013.01); *B32B 2551/00* (2013.01); *C08K 3/22* (2013.01); *C08K 3/40* (2013.01); *C08K 5/101* (2013.01); *C08K 2201/003* (2013.01); *C08K 2201/011* (2013.01); *C09J 133/08* (2013.01); *C09J 2201/606* (2013.01); *C09J 2201/622* (2013.01); *C09J 2203/318* (2013.01); *C09J 2205/102* (2013.01); *C09J 2205/114* (2013.01); *C09J 2433/00* (2013.01); *C09J 2467/005* (2013.01)

(58) Field of Classification Search
CPC ..................... H01L 51/5271; H01L 51/5275
See application file for complete search history.

(56) References Cited

U.S. PATENT DOCUMENTS

| 8,089,208 B2 * | 1/2012 | Yamada | H01L 51/5275 313/114 |
| 8,704,261 B2 * | 4/2014 | Komatsu | H01L 33/505 257/98 |
| 2009/0162617 A1 | 6/2009 | Moroishi et al. | |

FOREIGN PATENT DOCUMENTS

| CN | 101542195 A | 9/2009 |
| CN | 102732188 A | 10/2012 |
| JP | 2010-254889 A | 11/2010 |

* cited by examiner

Primary Examiner — Cuong Q Nguyen
(74) Attorney, Agent, or Firm — Oliff PLC

(57) ABSTRACT

An optical laminate body including: a substrate; and an adhesive layer formed on substrate, wherein the optical laminate body is used such that a surface thereof on the adhesive layer side is attached to a glass-made light-emitting surface member, a relationship n3≥n2≥n1 is satisfied where n1 is a refractive index of the glass that constitutes light-emitting surface member, n2 is a refractive index of the adhesive layer, and n3 is a refractive index of the substrate, the adhesive layer is composed of an acrylic adhesive composition containing an acrylic resin (A), and the acrylic resin (A) is a copolymer of a copolymerizable component [I] containing 40% by weight to 93% by weight of an aromatic ring-containing monomer (a1), and 7% by weight to 60% by weight of a hydroxy group-containing monomer (a2), the weight average molecular weight of the acrylic resin (A) being 200,000 or less.

14 Claims, No Drawings

OPTICAL LAMINATE BODY AND SURFACE LIGHT SOURCE DEVICE

FIELD

The present invention relates to an optical laminate body and a surface light source device.

BACKGROUND

In recent years in a constitution of a surface light source device including an organic electroluminescent element (this may be appropriately referred to hereinbelow as "organic EL element"), lamination of a surface light-emitting body including an organic EL element and a light extraction film (a film having a concavo-convex structure on the surface thereof for enhancing light extraction efficiency) that is to be provided on the light-emitting surface of the surface light-emitting body is effected with an adhesive layer interposed therebetween. With such a surface light source device, light emitted from the organic EL element passes through the adhesive layer and the light extraction film, and is emitted to the outside of the device. In this surface light source device, a high refractive index of the adhesive layer is particularly advantageous for enhancing the light extraction efficiency. As a means for giving a high refractive index to the adhesive layer, there has been known a method of adding an inorganic oxide that is a high refractive index material to an adhesive composition that exhibits adhesive force (e.g., refer to Patent Literature 1).

CITATION LIST

Patent Literature

Patent Literature 1: Japanese Patent Application Laid-open No. 2010-254889 A

SUMMARY

Technical Problem

Although, as described in Patent Literature 1, an adhesive layer having a high refractive index can be realized by adding an inorganic oxide having a high refractive index to the adhesive agent (resin), such an addition may cause gelation when the adhesive agent has low compatibility with the inorganic oxide, and such a gelated adhesive agent is not usable. Furthermore, even when an adhesive agent that has a high compatibility with an inorganic oxide is used, addition of a large amount of the inorganic oxide aiming at high refractive index may cause reduction in adhesive force, and spoils intrinsic function of the adhesive layer. Such an adhesive agent thus shows poor practical usefulness. Accordingly, as the adhesive agent for forming the adhesive layer, an adhesive agent that is capable of achieving a high refractive index and has sufficient adhesiveness has been demanded. If a substrate is laminated with a glass-made light-emitting surface member with such an adhesive agent interposed therebetween, efficient extraction of light emitted from the light emitting element can be realized.

The present invention has been made to overcome the aforementioned problems, and it is an object of the present invention to provide an optical laminate body that is capable of more efficiently extracting light emitted from a light emitting element having a glass-made light-emitting surface member by forming an adhesive layer using an adhesive agent that is capable of achieving a high refractive index and having sufficient adhesiveness, and to provide a surface light source device including such an optical laminate body.

Solution to Problem

The inventor of the present invention has diligently conducted studies under such circumferences and has found out that use of a specific acrylic adhesive composition with a constitution which satisfies specific relationship of refractive indices of respective layers can solve the aforementioned problems. Accordingly, the inventor has completed the present invention. According to the present invention, the following <1> to <14> are provided.

<1> An optical laminate body comprising: a substrate; and an adhesive layer formed on the substrate, wherein the optical laminate body is used such that a surface thereof on the adhesive layer side is attached to a glass-made light-emitting surface member, a relationship $n3 \geq n2 \geq n1$ is satisfied where $n1$ is a refractive index of the glass that constitutes the light-emitting surface member, $n2$ is a refractive index of the adhesive layer, and $n3$ is a refractive index of the substrate, the adhesive layer is composed of an acrylic adhesive composition containing an acrylic resin (A), and the acrylic resin (A) is a copolymer of a copolymerizable component [I] containing 40% by weight to 93% by weight of an aromatic ring-containing monomer (a1), and 7% by weight to 60% by weight of a hydroxy group-containing monomer (a2), the weight average molecular weight of the acrylic resin (A) being 200,000 or less.

<2> The optical laminate body according to <1>, wherein the acrylic adhesive composition contains an inorganic oxide (B).

<3> The optical laminate body according to <2>, wherein the inorganic oxide (B) is particles having a volume average particle diameter of 5 nm to 50 nm, and the acrylic adhesive composition contains 80 to 130 parts by weight of the inorganic oxide (B) with respect to 100 parts by weight of the acrylic resin.

<4> The optical laminate body according to any one of <1> to <3>, wherein the acrylic adhesive composition contains a cross-linking agent (C).

<5> The optical laminate body according to any one of <1> to <4>, wherein the acrylic adhesive composition contains a plasticizer (D).

<6> The optical laminate body according to <5>, wherein the acrylic adhesive composition contains 5 parts by weight to 20 parts by weight of the plasticizers (D) with respect to 100 parts by weight of the acrylic resin (A).

<7> The optical laminate body according to <5> or <6>, wherein the plasticizer (D) has a melting point of 0° C. or lower.

<8> The optical laminate body according to any one of <5> to <7>, wherein the plasticizer (D) is selected from the group consisting of ester-based plasticizers.

<9> The optical laminate body according to <8>, wherein the plasticizer (D) is a benzoic acid ester.

<10> The optical laminate body according to any one of <1> to <9>, wherein a difference (n3−n2) between the refractive index n3 of the substrate and the refractive index n2 of the adhesive layer is 0.02 or less.

<11> The optical laminate body according to any one of <1> to <10>, wherein a difference (n2−n1) between the refractive index n2 of the adhesive layer and the refractive index n1 of the glass is 0.02 or less.

<12> The optical laminate body according to any one of <1> to <11>, wherein the refractive index n2 of the adhesive layer is 1.53 or more.

<13> The optical laminate body according to any one of <1> to <12>, wherein the optical laminate body further includes a concavo-convex structure layer formed on the substrate.

<14> A surface light source device comprising: a surface light-emitting body having a glass-made light-emitting surface member; and the optical laminate body according to any one of <1> to <13>, wherein the adhesive layer is attached to the light-emitting surface member.

Advantageous Effects of Invention

The optical laminate body according to the present invention provides the advantageous effect such that the optical laminate body is capable of more efficiently extracting light emitted from a light emitting element having a glass-made light-emitting surface member by forming an adhesive layer using an adhesive agent achieving a high refractive index and having sufficient adhesiveness and by constituting respective layers so that their refractive indices satisfy a specific relationship. The surface light source device according to the present invention provides an advantageous effect such that a light-emitting surface member can be made brighter without changing a layer structure.

DESCRIPTION OF EMBODIMENTS

The present invention will be specifically explained hereinbelow referring to embodiments and examples. However, the present invention is not limited to the following embodiments and examples, and may be implemented with any modifications without departing from the scope of claims and equivalents thereto.

In the present application, the term "solvent" is used, for the sake of description, not only for a medium that constitutes a solution in which a solute is dissolved but also for a medium that constitutes a suspension (including slurry) in which a dispersoid is dispersed. In the present application, "compatibility" between a substance and other substance means their property of keeping a homogeneous state without gelation or separation when those substances and, if necessary, a solvent are blended to form a solution or a suspension. Furthermore, in the present invention, (meth) acryl- is a term that includes acryl- and methacryl-, (meth) acryloyl- is a term that includes acryloyl- and methacryloyl-, (meth)acrylate is a term that includes acrylate and methacrylate, and acrylic resin means a resin obtained by polymerization of a monomer component containing at least one type of (meth)acrylic monomer.

<Optical Laminate Body>

The optical laminate body according to the present invention includes a substrate and an adhesive layer formed on the substrate. The optical laminate body is formed in a shape of a sheet or a film.

<Substrate>

Although a material that constitutes the substrate is not particularly limited, the substrate is used by being laminated on a glass-made light-emitting surface member of a surface light-emitting body including an organic EL element, and the substrate therefore has to have transparency. As the material, a resin composition including a transparent resin may be usually used. That the transparent resin is "transparent" means that the transparent resin has light transmittance to an extent suitable for being used as an optical member. In the present example, an adhesive layer, a substrate plate, and other layers described later that constitute an optical laminate body may be appropriately constituted so that the optical laminate body has total light transmittance of 80% or higher as the entirety thereof. The "glass-made light-emitting surface member" is a light-emitting surface member of a surface light-emitting body that has a glass layer as the outermost layer for light emission.

The transparent resin is not particularly limited, and examples thereof may include a thermoplastic resin. Examples of the thermoplastic resin may include a polyester resin, a polyacrylate resin, and a cycloolefin polymer resin. Particularly, an alicyclic olefin polymer film (e.g., ZEONOR film produced by ZEON Corporation) and a polyester film are preferable. To be more specific, examples of the material that constitutes the substrate may include a polyester resin, such as a polyethylene naphthalate, a polyethylene terephthalate, a polybutylene terephthalate, and a polyethylene terephthalate/isophthalate copolymer; a polyolefin resin such as a polyethylene, a polypropylene, and a polymethylpentene; a polyfluoroethylene resin such as a polyvinyl fluoride, a polyvinylidene fluoride, and a polyethylene fluoride; a polyamide such as a nylon 6, and a nylon 6/6; a vinyl polymer such as a polyvinyl chloride, a polyvinyl chloride/ vinyl acetate copolymer, an ethylene-vinylacetate copolymer, an ethylene-vinyl alcohol copolymer, a polyvinyl alcohol, and a vinylon; a cellulose resin such as a cellulose triacetate, and a cellophane; an acrylic resin such as a polymethyl methacrylate, a polyethyl methacrylate, a polyethyl acrylate, and a polybutyl acrylate; a polystyrene; a polycarbonate; a polyarylate; and a polyimide.

When the substrate is placed on the outermost surface of the surface light source device, a material having high wear resistance is preferably used for the substrate. To be more specific, when a layer composed of a resin whose film thickness is 7 μm is formed on a substrate plate by using the aforementioned resin, it is preferable that the material gives the layer a pencil hardness of HB or higher, more preferable that the material gives the layer a pencil hardness of H or higher, and still more preferable that the material gives the layer a pencil hardness of 2H or higher.

Although the thickness of the substrate is not particularly limited, the thickness is usually 50 μm to 100 μm.

Furthermore, a refractive index $n_3$ of the substrate is usually 1.53 or more, and preferably 1.60 or more.

The refractive index $n_3$ of the substrate satisfies the relationship $n_3 \geq n_2 \geq n_1$, where $n_1$ is the refractive index of the glass that constitutes the light-emitting surface member of the surface light-emitting body and $n_2$ is the refractive index of the adhesive layer. Particularly, the difference ($n_3-n_2$) between the refractive index $n_3$ of the substrate and the refractive index $n_2$ of the adhesive layer is preferably 0.05 or less, and more preferably 0.02 or less. When the difference in the refractive indices is within the aforementioned range, loss of light at an interface can be reduced and light extraction efficiency can be further improved. The substrate may be used as a monolayer body or a multilayer body in which two or more types of layers are laminated.

<Adhesive Layer>

The adhesive layer is composed of an acrylic adhesive composition containing an acrylic resin (A).

The acrylic resin (A) is formed by copolymerizing a copolymerizable component [I] containing 40% by weight to 93% by weight of an aromatic ring-containing monomer (a1), and 7% by weight to 60% by weight of a hydroxy group-containing monomer (a2) as essential ingredients. The copolymerizable component [I] may contain, as necessary, a (meth)acrylic acid alkyl ester-based monomer (a3) and another copolymerizable monomer (a4).

The aromatic ring-containing monomer (a1) may be a compound having one or more aromatic rings and one or more ethylenically unsaturated group in one molecule. Examples of functional groups including such ethylenically unsaturated group may include (meth)acryloyl group, crotonoyl group, vinyl group, and allyl group, and in view of excellent reactivity, the (meth)acryloyl group is preferable.

Furthermore, examples of the aromatic ring may include a benzene ring, a naphthalene ring, an anthracene ring, a biphenyl ring, and a fluorene ring, and the number of the aromatic ring per one molecule may be one, and may also be a plural number. The aromatic ring-containing monomer (a1) is preferably a compound that contains one aromatic ring per one molecule in view of balanced adhesion properties, and preferably a compound that contains two aromatic rings per one molecule in view of efficient controls of the refractive index and birefringence of the adhesive agent layer.

Examples of the aromatic ring-containing monomer (a1) may include benzyl (meth)acrylate, benzyloxy ethyl (meth)acrylate, phenoxyethyl (meth)acrylate, phenoxy diethylene glycol (meth)acrylate, ethyleneoxide denaturalized cresol (meth)acrylate, ethyleneoxide denaturalized nonyl phenol (meth)acrylate, (meth)acrylic acid biphenyloxyethyl ester, and styrene. In particular, benzyl (meth)acrylate and phenoxyethyl (meth)acrylate is preferable. Only one of them may be used, and two or more types of them may also be used in combination.

Examples of the hydroxy group-containing monomer (a2) may include a primary hydroxy group-containing monomer, such as acrylic acid hydroxy alkyl esters such as 2-hydroxyethyl (meth)acrylate, 4-hydroxybutyl (meth)acrylate, 5-hydroxypentyl (meth)acrylate, 6-hydroxyhexyl (meth)acrylate, and 8-hydroxyoctyl (meth)acrylate, caprolactone denaturalized monomers such as caprolactone denaturalized 2-hydroxyethyl (meth)acrylate, oxyalkylene denaturalized monomers such as diethylene glycol (meth)acrylate, and a polyethylene glycol (meth)acrylate, and others such as a 2-acryloyloxyethyl 2-hydroxyethylphthalic acid, N-methylol (meth)acrylamide, and hydroxyethyl acrylamide; a secondary hydroxy group-containing monomer, such as 2-hydroxypropyl (meth)acrylate, 2-hydroxybutyl (meth)acrylate, and 3-chloro2-hydroxypropyl (meth)acrylate; and a tertiary hydroxy group-containing monomer, such as 2,2-dimethyl2-hydroxyethyl (meth)acrylate.

Only one of the hydroxy group-containing monomers (a2) may be used, and two or more types thereof may also be used in combination.

Among the hydroxy group-containing monomers (a2), the primary hydroxy group-containing monomer is preferable in view of excellent reactivity with a cross-linking agent which will be described later, and a monomer having a hydroxy group at the molecular chain terminal thereof is also preferable because such a monomer is prone to exhibit better antistatic performance. Furthermore, the 2-hydroxyethyl (meth)acrylate is preferably used, in particular, in view of less impurities such as di(meth)acrylate, and the easiness of production.

As the hydroxy group-containing monomer (a2), a monomer whose content ratio of di(meth)acrylate, which is an impurity, is 0.5% by weight or less is preferably used, the monomer whose content ratio of di(meth)acrylate is 0.2% by weight or less is more preferably used, and the monomer whose content ratio of di(meth)acrylate is 0.1% by weight is still more preferably used. To be more specific, 2-hydroxyethyl acrylate and 2-hydroxypropyl acrylate are preferable.

As the (meth)acrylic acid alkyl ester-based monomer (a3), for example, a compound whose carbon number of an alkyl group is usually 1 to 20, particularly 1 to 12, more particularly 1 to 8, and still more particularly 4 to 8 is preferable. Specific examples thereof may include methyl (meth)acrylate, ethyl (meth)acrylate, n-butyl (meth)acrylate, iso-butyl (meth)acrylate, tert-butyl (meth)acrylate, n-propyl (meth)acrylate, n-hexyl (meth)acrylate, 2-ethylhexyl (meth)acrylate, n-octyl (meth)acrylate, isodecyl (meth)acrylate, lauryl (meth)acrylate, cetyl (meth)acrylate, stearyl (meth)acrylate, cyclohexyl (meth)acrylate, and isobornyl (meth)acrylate. Only one of them may be used, and two or more types of them may also be used in combination.

Among the (meth)acrylic acid alkyl ester-based monomers (a3), in terms of copolymerization property, adhesion property, handling capability, and raw material availability, n-butyl (meth)acrylate and 2-ethylhexyl (meth)acrylate are preferably used in particular, and n-butyl (meth)acrylate is more preferably used in terms of excellent durability.

Examples of other copolymerizable monomers (a4) may include a functional group-containing monomer, such as a carboxy group-containing monomer, an amino group-containing monomer, an acetoacetyl group-containing monomer, an isocyanate group-containing monomer, and a glycidyl group-containing monomer.

Examples of the carboxy group-containing monomer may include (meth)acrylic acid, an acrylic acid dimer, crotonic acid, maleic acid, maleic anhydride, fumaric acid, citraconic acid, glutaconic acid, itaconic acid, acrylamide N-glycolic acid, and cinnamic acid, and particularly (meth)acrylic acid is preferably used.

Examples of the amino group-containing monomer may include t-butylaminoethyl (meth)acrylate, ethylaminoethyl (meth)acrylate, dimethylaminoethyl (meth)acrylate, and diethylaminoethyl (meth)acrylate.

Examples of the acetoacetyl group-containing monomer may include 2-(acetoacetoxy)ethyl (meth)acrylate, and allyl acetoacetate.

Examples of the isocyanate group-containing monomer may include 2-acryloyloxyethyl isocyanate, 2-methacryloyloxy-ethyl isocyanate, and alkylene oxide adducts of them.

Examples of the glycidyl group-containing monomer may include glycidyl (meth)acrylate, and allylglycidyl (meth) acrylate.

Furthermore, when being intended to achieve a higher molecular weight, a compound having two or more ethylenically unsaturated groups, such as ethylene glycol di(meth)acrylate, diethylene glycol di(meth)acrylate, triethylene glycol di(meth)acrylate, polyethylene glycol di(meth)acrylate, propylene glycol di(meth) acrylate, and divinylbenzene may also be used in combination.

Furthermore, as the adhesive layer, an acidic group-containing monomer, such as a carboxy group-containing monomer that is commonly used for a general adhesive layer, may be used together with other monomers as long as advantageous effects of the present invention are not impaired. However, it is not preferable to use the acidic group-containing monomer in terms of corrosion resistance.

Examples of other copolymerizable monomers (a4) may further include a monomer containing an alkoxy group and an oxyalkylene group, such as 2-methoxyethyl (meth)acrylate, 2-ethoxyethyl (meth)acrylate, 3-methoxybutyl (meth) acrylate, 2-butoxyethyl (meth)acrylate, 2-butoxy diethylene glycol (meth)acrylate, methoxy diethylene glycol (meth) acrylate, methoxy triethylene glycol (meth)acrylate, ethoxy diethylene glycol (meth)acrylate, methoxy dipropylene glycol (meth)acrylate, methoxy polyethylene glycol (meth)acrylate, octoxy polyethylene-glycol polypropylene glycol mono-(meth)acrylate, lauroxy polyethylene glycol mono-(meth)acrylate, and stearoxy polyethylene glycol mono-(meth)acrylate; an alkoxyalkyl (meth)acrylamide-based monomer, such as methoxymethyl (meth)acrylamide, ethoxymethyl (meth)acrylamide, propoxymethyl (meth)acrylamide, isopropoxymethyl (meth)acrylamide, n-butoxymethyl (meth)acrylamide, and isobutoxymethyl (meth)acrylamide; a (meth)acrylamide-based monomer, such as (meth)acryloylmorpholine, dimethyl (meth)acrylamide, diethyl (meth)acrylamide, and (meth)acrylamide N-methylol (meth)acrylamide; and acrylonitrile, methacrylonitrile, vinyl acetate, vinyl propionate, vinyl stearate, vinyl chloride, vinylidene chloride, an alkyl vinyl ether, vinyltoluene, vinylpyridine, vinyl pyrrolidone, a dialkyl ester of itaconic acid, a dialkyl ester of fumaric acid, allyl alcohol, acrylic chloride, methyl vinyl ketone, N-acrylamide methyl trimethylammonium chloride, allyl trimethylammonium chloride, and dimethylallyl vinyl ketone. Only one of other copolymerizable monomers (a4) may be used, and two or more types of them may also be used in combination.

The content of the aromatic ring-containing monomer (a1) is essentially 40% by weight to 93% by weight, preferably 50% by weight to 90% by weight, more preferably 55% by weight to 85% by weight, and still more preferably 60% by weight to 85% by weight, with respect to the total amount of the copolymerizable components. When the content of the aromatic ring-containing monomer is too small, sufficiently high refractive index may not be obtained, which is not preferable. When the content of the aromatic ring-containing monomer is too large, adhesion performance may be deteriorated, which is not preferable.

The content of the hydroxy group-containing monomer (a2) is essentially 7% by weight to 60% by weight, preferably 10% by weight to 50% by weight, more preferably 10% by weight to 40% by weight, and still more preferably 10% by weight to 35% by weight, with respect to the total amount of the copolymerizable component. When the content of the hydroxy group-containing monomer (a2) is too small, e.g. in a case wherein an inorganic oxide is blended, compatibility with the inorganic oxide may be lowered and dispersibility may be deteriorated, which is not preferable. When the content of the hydroxy group-containing monomer (a2) is too large, content of the aromatic ring-containing monomer (a1) may be relatively lowered, which is not preferable in that sufficiently high refractive index may not be obtained.

The content of the (meth)acrylic acid alkyl ester-based monomer (a3) when being copolymerized is preferably 0% by weight to 40% by weight, more preferably 0% by weight to 35% by weight, and still more preferably 0% by weight to 30% by weight with respect to the total amount of the copolymerizable components. When the content of the (meth)acrylic acid alkyl ester-based monomer (a3) is too small, there may occur tendency of decrease in adhesion performance.

The content of other copolymerizable monomers (a4) when being copolymerized is preferably 0% by weight to 40% by weight, more preferably 0% by weight to 30% by weight, and still more preferably 0% by weight to 20% by weight with respect to the total amount of the copolymerizable components. When the content of each of the other copolymerizable monomers (a4) is too large, content of the aromatic ring-containing monomer (a1) may be relatively lowered, which may cause tendency of insufficiency in the elevation of the refractive index.

Furthermore, the content ratio (weight ratio) of the aromatic ring-containing monomer (a1) and the hydroxy group-containing monomer (a2) is preferably in the range of (a1):(a2)=93:7 to 40:60, more preferably 90:10 to 50:50, and still more preferably 85:15 to 60:40. When the content of the aromatic ring-containing monomer (a1) with respect to the hydroxy group-containing monomer (a2) is too large, e.g. in a case wherein an inorganic oxide is blended, compatibility with the inorganic oxide may be lowered, which may cause tendency of lowering in dispersibility. When the content of the aromatic ring-containing monomer (a1) with respect to the hydroxy group-containing monomer (a2) is too small, there may occur tendency of lowering in refractive index.

The acrylic resin (A) may be produced by polymerization of the monomer components (a1) to (a4). In the polymerization, a publicly known method in prior art, such as solution radical polymerization, suspension polymerization, block polymerization, and emulsion polymerization, may be performed. Among them, the solution radical polymerization is preferable.

As to the polymerization conditions, publicly known general polymerization conditions in prior art may be adopted as well. For example, polymerization monomers such as the aromatic ring-containing monomer (a1), the hydroxy group-containing monomer (a2), the (meth)acrylic acid alkyl ester-based monomer (a3) and other copolymerizable monomer (a4), and a polymerization initiator (such as azobisisobutyronitrile, azobisisovaleronitrile, benzoyl peroxide) are mixed or added dropwise into an organic solvent, and the radical polymerization is performed under a reflux condition or under the condition of 50° C. to 90° C. for usually 2 hours to 20 hours, to thus produce the acrylic resin (A).

Examples of the organic solvent used for the polymerization may include aromatic hydrocarbons such as toluene and xylene; esters such as methyl acetate, ethyl acetate and butyl acetate; fatty alcohols such as n-propyl alcohol and isopropyl alcohol; and ketones such as acetone, methyl ethyl ketone, methyl isobutyl ketone and cyclohexanone.

Specific examples of a polymerization initiator used for the radical copolymerization may include azo-based polymerization initiators such as azobisisobutyronitrile and azobis dimethylvaleronitrile; and peroxide-based polymerization initiators such as benzoyl peroxide, lauroyl peroxide, di-t-butyl peroxide, and cumene hydroperoxide, which are general radical polymerization initiators.

The weight average molecular weight of the acrylic resin (A) is essentially 200,000 or less, preferably 10,000 to 180,000, more preferably 10,000 to 160,000, and still more preferably 10,000 to 150,000. When the weight average molecular weight is too large, e.g., in a case wherein an inorganic oxide is blended, compatibility with the inorganic oxide may be lowered and dispersibility may be lowered, which is not preferable.

The degree of dispersion (weight average molecular weight/number average molecular weight) of the acrylic resin (A) is preferably 10 or less, more preferably 8 or less, still more preferably 6 or less, and particularly preferably 5 or less. Excessively high degree of dispersion may cause tendency to lower durability of the adhesive agent layer.

The lower limit of the degree of dispersion is usually 1.1 in terms of a producing limit.

In addition, the glass transition temperature of the acrylic resin (A) is preferably in the range from −70° C. to 10° C., more preferably in the range from −50° C. to 5° C., and still more preferably in the range from −40° C. to 0° C. When the glass transition temperature is too high, there may occur tendency of excessive increase in adhesive force. When the glass transition temperature is too low, there may occur tendency of lowering in heat-resistance.

The aforementioned weight average molecular weight is a weight average molecular weight converted into a standard polystyrene molecular weight, and measured by using a serial set of three columns Shodex GPC KF-806L (exclusion limit molecular weight: $2\times10^7$, separation range: 100 to $2\times10^7$, the number of theoretical stage: 10,000 stages/column, filler material: styrene divinylbenzene copolymer, and filler grain size: 10 μm) in a high performance chromatography ("Waters 2695 (main unit)" and "Waters 2414" (detector), each produced by Nihon Waters K.K.), and a number average molecular weight may also be measured by the same method. Furthermore, the degree of dispersion may be obtained from the weight average molecular weight and the number average molecular weight. In addition, the glass transition temperature is a value calculated by the following Fox equation.

$$1/Tg=Wa/Tga+Wb/Tgb+\ldots Wn/Tgn$$

Tg: Glass transition temperature (K) of copolymer

Tga: Glass transition temperature (K) of homopolymer of monomer A

Wa: Weight fraction of monomer A

Tgb: Glass transition temperature (K) of homopolymer of monomer B

Wb: Weight fraction of monomer B

Tgn: Glass transition temperature (K) of homopolymer of monomer N

Wn: Weight fraction of monomer N (Wa+Wb+ . . . +Wn=1)

The aforementioned acrylic adhesive composition may contain an inorganic oxide (B), a cross-linking agent (C), and/or a plasticizer (D) in addition to the acrylic resin (A).

<Inorganic Oxide (B)>

As the inorganic oxide (B) has a comparatively high refractive index, the inorganic oxide (B) is preferably added for the purpose of achieving a high refractive index of the adhesive layer in a range wherein the adhesive force is not impaired. There is no particular limitation to the inorganic oxide (B), a metal oxide is preferable. In particular, it is preferable to use a particle including a metal oxide and an organic substance that modifies the surface of the metal oxide and has a reactive functional group. To be more specific, it is preferable to use a coated particle including the particle of the metal oxide and the organic substance that modifies the surface of the particle and has the reactive functional group (this may be referred to hereinbelow as "reactive modified metal oxide particle"). The reactive functional group may be in a state of interaction, such as a hydrogen bond, with the metal oxide. The reactive functional group may not be in such a state so that the reactive functional group is capable of interacting with another substance. The aforementioned inorganic oxide (B) is preferably inorganic oxide fine particles that are in a state of fine particles. Furthermore, as form of the inorganic oxide fine particles, fine powder, paste, sol, or the like may be exemplified, and sol is preferable.

As the metal oxide, it is preferable to use a metal oxide that are generally used as a filler of a resin. Examples of the metal oxide may include zirconium oxide ($ZrO_2$: zirconia), titanium oxide ($TiO_2$: titania), aluminum oxide ($Al_2O_3$: alumina), iron oxide ($Fe_2O_3$, $Fe_3O_4$), copper oxide (CuO), zinc oxide (ZnO), yttrium oxide ($Y_2O_3$: yttria), niobium oxide ($Nb_2O_5$), molybdenum oxide ($MoO_3$, $MoO_2$), indium oxide ($In_2O_3$), tin oxide ($SnO_2$), tantalum oxide ($Ta_2O_5$, $TaO_2$), tungsten oxide ($WO_3$, $WO_2$), lead oxide (PbO), bismuth oxide ($Bi_2O_3$), cerium oxide ($CeO_2$: ceria), antimony oxide ($Sb_2O_3$, $Sb_2O_5$), tin-doped indium oxide (ITO), antimony-doped tin oxide (ATO), fluorine-doped tin oxide (FTO), phosphorus-doped tin oxide (PTO), zinc antimonate (AZO), indium-doped zinc oxide (IZO), aluminum-doped zinc oxide, and gallium-doped zinc oxide. Furthermore, examples of the aforementioned nonmetallic oxide may include silicon oxide ($SiO_2$: silica), and boron oxide ($B_2O_3$), which are generally used as a filler of a resin. Only one of the metal oxide and the nonmetallic oxide may be used, and they may also be co-used. In particular, zirconium oxide ($ZrO_2$: zirconia) and titanium oxide ($TiO_2$: titania) are preferable since therewith, e.g., an acrylic resin having a high refractive index can be easily produced.

Examples of the reactive functional group in the organic substance having a reactive functional group may include hydroxy group, phosphate group, carboxy group, amino group, alkoxy groups, isocyanate group, acid halides, acid anhydrides, glycidyl group, chlorosilicane group, and alkoxysilane group. As the organic substance having a reactive functional group, an organic substance having isocyanate group is particularly preferable because of its ability to improve stability of the metal oxide with surrounding substances. Examples of the organic substance having isocyanate group may include acryloxymethyl isocyanate, methacryloxymethyl isocyanate, acryloxyethyl isocyanate, methacryloxyethyl isocyanate, acryloxyprophyl isocyanate, methacryloxypropyl isocyanate, and 1,1-bis(acryloxymethyl)ethyl isocyanate.

In the reactive modified metal oxide particles, the content ratio of the organic substance having a reactive functional group may be 1 part to 40 parts by weight with respect to 100 parts by weight of the metal oxide.

The reactive modified metal oxide particles may be produced as a suspension in which the particles are dispersed in an organic solvent by a method wherein the particles of the metal oxide, the organic substance having a reactive functional group, an organic solvent, and an optional additive that may be added as necessary are mixed, and optionally a treatment such as ultrasonication is applied to the resulting mixture.

Examples of the organic solvent may include ketones such as methyl ethyl ketone, methyl isobutyl ketone, acetone and cyclohexanone; aromatic hydrocarbons such as benzene, toluene, xylene and ethylbenzene; alcohols such as methanol, ethanol, isopropyl alcohol, n-butanol and isobutanol; ethers such as ethylene glycol monomethyl ether, ethylene glycol monoethyl ether, ethylene glycol monobutyl ether, diethylene glycol monomethyl ether and diethylene glycol monoethyl ether; esters such as ethyl acetate, butyl acetate, ethyl lactate, gamma-butyrolactone, propylene glycol monomethyl ether acetate, propylene glycol monoethyl ether acetate; and amides such as dimethylformamide, N,N-dimethylacetoacetamide and N-methyl pyrrolidone. As the organic solvent, one of them may be solely used, and a mixture of two or more may also be used. Examples of the optional additive that may be added to the resulting mixture may include a metal chelate agent.

When the reactive modified metal oxide particles are obtained as a suspension in which the particles are dispersed in an organic solvent, it is preferable for convenience in production that conditions such as an amount of the solvent are adjusted so that the reactive modified metal oxide particles are contained by 1% by weight to 50% by weight in the suspension, and the resulting suspension as it is is subjected to the producing of an adhesive composition.

In preparation of the mixture, it is preferable to mix the respective components using, e.g., a bead mill. By such mixing, secondary particles or other higher-order aggregated particles can be pulverized into a primary particle level, and surface treatment can be performed with the particles in a state of a primary particles. As a result, uniform surface treatment can be performed.

If necessary, the mixture may be further subjected to ultrasonication. The ultrasonication may be performed by using an apparatus such as an ultrasonic washing machine, an ultrasonic homogenizer, and an ultrasonic disperser. By such ultrasonication, an excellent suspension can be obtained.

As the reactive modified metal oxide particles, commercially available particles as they are may also be used. The commercially available particles may be provided as a slurry containing components such as a solvent and an additive. The slurry as it is containing such components may be used as a material of the adhesive composition according to the present invention. Example of the slurry of the reactive modified metal oxide particles containing $ZrO_2$ as the metal oxide may include product name "NANON5 ZR-010" (produced by SOLAR Co., Ltd., solvent: methyl ethyl ketone, particle content ratio: 30%, organic substance having reactive functional group that modifies surface: isocyanate having polymerizable functional group, volume average particle diameter: 15 nm). Examples of the slurry of the reactive modified metal oxide particles containing $TiO_2$ as the metal oxide may include product name "NOD-742GTF" (produced by Nagase ChemteX Corporation, solvent: polyethylene glycol monomethyl ether, particle content ratio: 30%, volume average particle diameter: 48 nm).

The volume average particle diameter of the aforementioned inorganic oxide (B) is preferably 5 nm or larger, more preferably 10 nm or larger, and still more preferably 20 nm or larger, and is preferably 50 nm or smaller, more preferably 40 nm or smaller, and still more preferably 30 nm or smaller. When the particle diameter is within the aforementioned range, an adhesive layer with low degree of coloring and high light transmittance can be obtained and dispersion of the particles can be facilitated. When a reactive modified metal oxide are in a state of aggregation to constitute secondary particles or other higher-order aggregated particles, the particle diameter may be set in the range of the primary particle diameter. The particle diameter may be measured using a dynamic light scattering-type particle size distribution analyzer (Nanotrac Wave-EX150 produced by NIKKISO Co., Ltd.) with the setting of the volume to be on a basis of the particle diameter.

The lower limit of the content ratio of the inorganic oxide (B) in an acrylic adhesive composition is preferably 80 parts by weight or more, more preferably 85 parts by weight or more, and still more preferably 90 parts by weight or more, with respect to 100 parts by weight of the acrylic resin (A). On the other hand, the upper limit of the content ratio of the inorganic oxide (B) is preferably 130 parts by weight or less, more preferably 120 parts by weight or less, and still more preferably 110 parts by weight or less, with respect to 100 parts by weight of the acrylic resin (A). When the content of the inorganic oxide (B) is small, a desired refractive index may not be obtained. When the content of the inorganic oxide (B) is large, adhesive force may become insufficient.

It is preferable that the inorganic oxide (B) has a high refractive index. Specifically, the refractive index is preferably 1.5 or higher. By employing an inorganic oxide having such a high refractive index, the content of the inorganic oxide (B) in the adhesive agent can be reduced, and sufficient adhesiveness of the adhesive agent can thereby be exerted. Examples of the inorganic oxide having a high refractive index may include a titanium oxide (refractive index: 2.3 to 2.7), a potassium titanate (refractive index: 2.68), a zirconium oxide (refractive index: 2.05 to 2.4), and a zinc oxide (refractive index: 2.01 to 2.03).

The cross-linking agent (C) may be blended for the purpose of cross-linking the acrylic resins (A), and is blended for the purpose of imparting durability to the adhesive layer as hardness to some extent, by cross-linking the acrylic resins (A). Examples of the cross-linking agent (C) may include a cross-linking agent that forms a chemical crosslink such as an isocyanate cross-linking agent, an epoxy cross-linking agent, an aziridine cross-linking agent, a melamine cross-linking agent, an aldehyde cross-linking agent, an amine cross-linking agent, and a metal chelate cross-linking agent, and a cross-linking agent that forms a physical crosslink such as a multi-functional acrylate cross-linking agent. Among them, a cross-linking agent that reacts with hydroxy group is preferable. Particularly preferable are the isocyanate cross-linking agent and the metal chelate cross-linking agent. In view of improving adhesion with a substrate, and in view of a reactive property with the acrylic resin (A), the isocyanate cross-linking agent is still more preferable.

Examples of the aforementioned isocyanate cross-linking agent may include 2,4-tolylene diisocyanate, 2,6-tolylene diisocyanate, hydrogenated tolylene diisocyanate, 1,3 xylylene diisocyanate, 1,4-xylylene diisocyanate, hexamethylene di-isocyanate, diphenylmethane-4,4-diisocyanate, isophorone diisocyanate, 1,3-bis(isocyanatomethyl)cyclohexane, tetramethylxylylene diisocyanate, 1,5-naphthalene diisocyanate, triphenylmethane triisocyanate, adducts of these polyisocyanate compounds with a polyol compound such as trimethylolpropane, and biuret bodies and isocyanurates of these polyisocyanate compounds.

Examples of the aforementioned metal chelate cross-linking agent may include an acetylacetone and an acetoacetyl ester coordination compound of polyvalent metal such as aluminum, iron, copper, zinc, tin, titanium, nickel, antimony, magnesium, vanadium, chromium, and zirconium.

As the cross-linking agent (C), one of them may be solely used, and two or more types of them may also be used in combination.

The content of the aforementioned cross-linking agent (C) is preferably 0.01 part by weight to 20 parts by weight, more preferably 0.02 part by weight to 15 parts by weight, and still more preferably 0.03 part by weight to 10 parts by weight, with respect to 100 parts by weight of the acrylic resin (A). When the amount of the cross-linking agent (C) is too small, cohesion may lower, and there may occur tendency of insufficiency in durability. When the amount of the cross-linking agent (C) is too large, flexibility and adhesive force may lower to cause peeling, which may consequently cause tendency of decrease in adhesion with a substrate or a glass material.

The aforementioned acrylic adhesive composition may contain an antistatic agent; other acrylic adhesive agents; other adhesive agents; a tackifier such as a urethane resin, a rosin, a rosin ester, a hydrogenated rosin ester, a phenol resin, an aromatic modified terpene resin, an aliphatic petroleum resin, an alicyclic petroleum resin, a styrene resin and a xylene resin; a variety of additives such as a colorant, a filler, an antiaging agent, an ultraviolet ray absorbent and a functional dye; and a compound that causes coloration or discoloration by exposure to ultraviolet or radiation, as far as the advantageous effects of the present invention are not impaired. Furthermore, in addition to the aforementioned additives, the adhesive composition may contain a small amount of impurities or the like that are contained in the raw materials or the like of the constituent of the acrylic adhesive composition. The amounts of the additives may be appropriately set so that desired properties are obtained.

Subsequently, explanation will be made regarding a method for forming an adhesive layer using the aforementioned acrylic adhesive composition. The adhesive layer may be formed by applying the acrylic adhesive composition onto a substrate, and drying and subsequently thermally curing the adhesive composition. When the substrate is possibly deteriorated by a solvent or the like, or the irradiation of heat, an active energy ray, or the like in drying, it is preferable that the adhesive composition is first applied onto a separator onto which a silicone agent or the like has been applied for giving a mold-release property, and the layer is then attached to the substrate.

In applying the aforementioned acrylic adhesive composition, the acrylic adhesive composition may be diluted with a solvent to give the adhesive composition a viscosity suitable for the application, before application onto the substrate. The dilution concentration in terms of the solid content concentration is preferably 5% by weight to 90% by weight, more preferably 10% by weight to 80% by weight, and still more preferably 20% by weight to 75% by weight. Furthermore, as the aforementioned solvent, any solvent may be used as long as the solvent dissolves an acrylic adhesive composition. Examples of the solvents for use may include an ester solvent such as methyl acetate, ethyl acetate, methyl acetoacetate and ethyl acetoacetate; a ketone solvent such as acetone, methyl ethyl ketone and methyl isobutyl ketone; an aromatic solvent such as toluene and xylene; and an alcohol solvent such as methanol, ethanol and propyl alcohol. In particular, it is preferable to use ethyl acetate or methyl ethyl ketone in view of solubility, drying properties, prices, and the like.

The viscosity (at 25° C.) of the acrylic adhesive composition diluted with the aforementioned solvent is preferably 20,000 mPa·s or less, more preferably 18,000 mPa·s or less, and still more preferably 15,000 mPa·s or less. The lower limit of the viscosity is usually 100 mPa·s. When the viscosity is excessively high, that may cause a tendency of increasing difficulty in the application because of, e.g., coating streaks are liable to occur. The measurement of viscosity may be performed in accordance with Rotational viscometer method specified in JIS K5400 (1990), Section 4.5.3.

The application of the aforementioned acrylic adhesive composition to the substrate may be performed by a conventional method such as roll coating, die coating, gravure coating, comma coating, and screen printing. Furthermore, the thickness of the adhesive agent layer (film thickness after being dried) is usually 3 μm to 500 μm, preferably 5 μm to 300 μm, and more preferably 10 μm to 250 μm.

As for the conditions for drying, the drying temperature is usually 50° C. to 250° C., preferably 60° C. to 150° C., more preferably 65° C. to 120° C., and still more preferably 70° C. to 95° C., and the drying time is usually 10 seconds to 10 minutes.

When the cross-linking agent (C) is used, it is preferable to perform aging treatment after forming the adhesive layer by using the aforementioned method. The aging treatment is performed for taking balance of adhesion properties. As the conditions for aging, the temperature is usually room temperature to 70° C., and the duration is usually 1 day to 30 days. To be more specific, the aging treatment may be performed under the conditions of, e.g., 1 day to 20 days at 23° C., preferably 3 days to 10 days at 23° C. or 1 day to 7 days at 40° C. In the present application, a cured layer of an adhesive composition before the aging treatment and a layer after the aging treatment are referred collectively to as an "adhesive layer".

<Plasticizer (D)>

The plasticizer (D) may be used for lowering the viscosity of the acrylic adhesive composition, and retaining adhesiveness. That is, when the acrylic adhesive composition contains particles, particularly reactive modified metal oxide particles, viscosity thereof is raised. As a result, adhesiveness thereof may lower. However, by the addition of the plasticizer (D) to the adhesive composition in this case, adhesiveness of the adhesive composition can be retained. As a result, both a high refractive index and high adhesiveness can be simultaneously achieved. The melting point of the aforementioned plasticizer (D) is preferably 0° C. or lower, and more preferably −10° C. or lower. The lower limit of the melting point is preferably −70° C. or higher, and more preferably −60° C. or higher. When the melting point of the plasticizer (D) is within this range, the plasticizer (D) has advantageous effects of having excellent compatibility, elimination of a residual adhesive material on the member to be attached, and moderate adhesiveness.

Examples of the plasticizer (D) may include polybutene, vinyl ethers, a polyether (including a polyalkylene oxide and a functionalized polyalkylene oxide), esters, a polyol (glycerol, for example), a petroleum resin, a hydrogenated petroleum resin, and a styrene compound (α-methylstyrene, for example). In particular, in view of an excellent miscibility with the acrylic adhesive composition, and a comparatively high refractive index, esters, and particularly an aromatic ring-containing ester such as a benzoic acid-based ester or a phthalate acid-based ester may be preferably used. Examples of the benzoic acid ester that may be used for the plasticizer (D) may include diethylene glycol dibenzoate, dipropylene glycol dibenzoate, benzyl benzoate, and 1,4-cyclohexane dimethanol dibenzoate. Particularly preferable examples of a benzoic acid ester-based plasticizer may include dipropylene glycol dibenzoate, and benzyl benzoate. Examples of the aforementioned phthalic acid-based ester may include dimethyl phthalate, diethyl phthalate, dibutyl phthalate, butyl benzyl phthalate, dicyclohexyl phthalate, and ethylphthalyl ethyl glycolate. Examples of commercially available products of the plasticizer (D) may include product name "BENZOFLEX 9-88SG" (produced by Eastman Chemical Company) and product name "α-methylstyrene" (produced by Mitsubishi Chemical Corporation).

The content ratio of the plasticizer (D) in the acrylic adhesive composition is preferably 5 parts by weight or more, and more preferably 10 parts by weight or more, and is preferably 20 parts by weight or less, and more preferably 15 parts by weight or less, with respect to 100 parts by weight of the acrylic resin (A).

<Other Components>

If necessary, the aforementioned acrylic adhesive composition may contain an optional component. Examples of such an optional component may include a silane coupling agent, light diffusion particles, and a solvent.

Example of the silane coupling agent may include vinyltrimetoxysilane, vinyltriethoxysilane, 2-(3,4-epoxycyclohexyl)ethyltrimethoxysilane, 3-glycidoxypropylmethyldimetoxysilane, 3-glycidoxypropyltrimetoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxyprophyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, 3-ureidopropyltriethoxysilane, 3-mercaptopropylmethyldimethoxysilane, 3-mercaptopropyltrimethoxysilane, bis(triethoxysilylpropyl)tetrasulfide, and 3-isocyanatepropyltriethoxysilane. As the silane coupling agent, one of them may be solely used, and two or more types of them may also be used as a mixture. Examples of commercially available silane coupling agent may include product name "KBM-803" (produced by Shin-Etsu Chemical Co., Ltd.).

When the acrylic adhesive composition contains the silane coupling agent, the content ratio of the silane coupling agent is preferably 0.05 part by weight or more, and more preferably 0.1 part by weight or more, and is preferably 5 parts by weight or less, and more preferably 3 parts by weight or less, with respect to 100 parts by weight of the acrylic resin (A).

Example of the solvent may include those that are the same as the examples of the organic solvents for use in the production of the aforementioned reactive modified metal oxide particles.

When the acrylic adhesive composition contains a solvent, the content ratio of the solvent is preferably 50 parts by weight or more, and more preferably 100 parts by weight or more, and is preferably 300 parts by weight or less, and more preferably 250 parts by weight or less, with respect to 100 parts by weight of the total solid content.

The acrylic adhesive composition may also contain light diffusion particles. As the light diffusion particles, an organic material may be used. Examples of the organic material may include a silicone resin, an acrylate resin, and a polystyrene resin. The particle diameter of the organic light diffusion particles is preferably 0.2 μm or larger, and more preferably 0.5 μm or larger, and is preferably 5 μm or smaller, and more preferably 3 μm or smaller.

Examples of commercially available organic light diffusion particles made of the silicone resin material may include product name "XC-99" (produced by Momentive Performance Materials Inc., volume average particle diameter of 0.7 μm). Examples of commercially available organic light diffusion particles made of the acrylate resin material may include product name "MP series" (produced by Soken Chemical & Engineering Co., Ltd., volume average particle diameter of 0.8 μm). Example of commercially available organic light diffusion particles made of the polystyrene resin material may include product name "SX series" (produced by Soken Chemical & Engineering Co., Ltd., volume average particle diameter of 3.5 μm).

As a result of producing by the production method using a solvent, or as a result of purchasing a commercially available product, the acrylic resin (A), the reactive modified metal oxide particles, the organic light diffusion particles, and the optional components that are described above may be obtained as a solution or a suspension in which they are dissolved or dispersed in a solvent. In this case, the solvent contained therein may be blended as it is for use as a part or all of the solvent as a component of the acrylic adhesive composition.

The refractive index n2 of the adhesive agent layer obtained in this manner is preferably 1.50 or more, more preferably 1.53 or more, and still more preferably 1.60 or more. The upper limit of the refractive index of the adhesive agent layer is usually 2.00. In this manner, the acrylic resin (A) that has a high refractive index and excellent compatibility with the particles of an inorganic oxide can be obtained. Accordingly, an adhesive layer composed of an acrylic adhesive composition that has a high refractive index and excellent adhesive force can be obtained. The refractive index may be measured with the use of an ellipsometer (M-2000 produced by J. A. Woollam Co., Inc.).

The total light transmittance of the aforementioned adhesive layer is preferably 80% or higher, and more preferably 85% or higher. The total light transmittance may be measured in accordance with JIS K 7136. The adhesion strength of the adhesive layer to glass is 5 N/25 mm or greater, or 7.5 N/25 mm or greater. As the adhesive layer has the adhesion strength to glass that is equal to or greater than the aforementioned numerical value, the adhesive layer can be preferably used as a material for the adhesive layer. The upper limit of the adhesion strength of the adhesive layer to glass has no particular restriction, and is usually equal to or smaller than 30 N/25 mm. The adhesion strength of the adhesive layer to glass may be measured in accordance with JIS K 6854-1.

On a surface of the substrate that is opposite to the adhesive-layer side surface, another layer may be formed. As such another layer, e.g., a concavo-convex structure layer may be formed. The concavo-convex structure layer is formed for the purpose of efficiently extracting light that has been emitted from the light-emitting surface member of the surface light-emitting body. In this case, the concavo-convex structure layer may constitute an exposed surface that is exposed outside.

It is preferable that the concavo-convex structure layer has a plurality of concave portions including inclined surfaces and flat portions located around the aforementioned concave portion. The concave portion is a portion formed in a recessed shape relative to the flat portion thus constituting a concave portion, and the flat portion is projected relative to the concave portion thus corresponding to the convex portion. With such a concavo-convex structure, the concavo-convex structure layer may be formed.

In a preferred example, the concavo-convex structure layer includes a plurality of concave portions each including four inclined surfaces, and flat portions located around the concave portion. The "inclined surface" is a surface that forms a non-parallel angle with respect to the exposed surface (outermost surface) of the concavo-convex structure layer. On the other hand, the surface on the flat portion is a flat surface parallel to the exposed surface. Each of the plurality of concave portions is a recessed portion in a square-pyramid shape, and the recessed portions are disposed with specific intervals. The four inclined surfaces that constitute the concave portion have a shape that is identical with each other, and the base of the aforementioned square-pyramid shape constitutes a square.

The length of each edge of the base of the concave portion may usually be in the range from 1 μm to 200 μm, and preferably in the range from 2 μm to 100 μm. The depth of the concave portion may usually be in the range from 1 μm to 50 μm, and preferably in the range from 2 μm to 40 μm.

In a preferred example, the concave portions are sequentially disposed with constant intervals along two in-plane directions X and Y that are orthogonal to each other. Furthermore, the part corresponding to the gap between adjacent concave portions in each of the aforementioned in-plane directions X and Y constitutes the flat portion. Accordingly, the concavo-convex structure layer has concave portions and flat portions in an alternate manner in each of the directions X and Y that are directions in a plane parallel to the exposed surface. One direction X of the two in-plane directions X and Y is parallel to two edges of the base. In the in-plane direction X, a plurality of the concave portions are aligned with constant intervals. Furthermore, the other in-plane direction Y of the two in-plane directions X and Y is parallel to the other two edges of the base. In the in-plane direction Y, a plurality of the concave portions are aligned with constant intervals. The flat portion that is the part corresponding to the gap may usually have a width size in the range from 0.1 µm to 50 µm.

The angle formed by each of the four inclined surfaces that constitute each of the concave portions and the flat portion (eventually, the light-emitting surface member) is preferably 10° or larger, and more preferably 20° or larger, and is preferably 170° or smaller, and more preferably 160° or smaller. In particular, when the shape of the concave portion is a quadrangular pyramid, the vertex angle of the quadrangular pyramid is preferably in the range from 30° to 120°.

In addition, in the exposed surface of the surface light source device, the distance in the thickness direction between the bottom of the concave portions and the distal end of the convex portions that are adjacent to each other may vary within a specific range, and may also be constant. The bottom of the concave portion refers to the most recessed part in each of the concave portions, and refers to a part wherein a distance between the part and the glass-made light-emitting surface member in the thickness direction is the shortest in each of the concave portions. Furthermore, the distal end of the convex portion refers to the most protruding part in each of the convex portions, and refers to a part wherein a distance between the part and the glass-made light-emitting surface member in the thickness direction is the longest in each of the convex portions.

The ratio of an area that the flat portion occupies with respect to the total of the area that the flat portion occupies and an area that the concave portion occupies (referred to hereinbelow as "flat portion ratio") may also be adjusted. To be more specific, when the flat portion ratio is in the range from 10% to 75%, excellent light extraction efficiency can be realized and enhancement of the mechanical strength of the concavo-convex structure layer can be achieved.

The concavo-convex structure layer may consist of a plurality of layers, and may also consist of a single layer. The concavo-convex structure layer may usually be formed of a resin composition containing a transparent resin. That the transparent resin is "transparent" means that the transparent resin has light transmittance to an extent suitable for being used as an optical member. The concavo-convex structure layer may have a total light transmittance of 80% or higher.

The aforementioned transparent resin is not particularly limited, and a variety of resins capable of forming a transparent layer may be used. Examples of the transparent resins may include a thermoplastic resin, a thermosetting resin, an ultraviolet curable resin, and an electron beam curable resin. In particular, the thermoplastic resin is easily deformable by heat, and the ultraviolet curable resin has a highly curable with high efficiency. Therefore use of each of these resins is preferable for realizing efficient forming of the concavo-convex structure layer.

Examples of the thermoplastic resin may include a polyester resin, a polyacrylate resin, and a cycloolefin polymer resin. Furthermore, examples of the ultraviolet curable resin may include an epoxy resin, an acrylic resin, a urethane resin, an ene-thiol resin, and an isocyanate resin. As these resins, a resin having a plurality of polymerizable functional groups may be preferably used. As the aforementioned resin, one type of them may be solely used, and two or more types of them may also be used in combination at any ratio.

In particular, as a material that constitutes the concavo-convex structure layer, it is preferable to use a material that has high hardness after the material is cured since therewith the concavo-convex structure can be easily formed and wear resistance of the concavo-convex structure can be easily obtained. To be more specific, when a resin layer having a film thickness of 7 µm is formed on a substrate without any concavo-convex structure, it is preferable the material gives the layer a pencil hardness of HB or higher, more preferable that the material gives the layer a pencil hardness of H or higher, and still more preferable that the material gives the layer a pencil hardness of 2H or higher. When such concavo-convex structure layer is formed, it is preferable that the substrate has flexibility to some extent for facilitating handling of the substrate in forming the concavo-convex structure layer and handling of the concavo-convex structure layer after forming the substrate. By combining such materials, it is possible to obtain an optical laminate body having a concavo-convex structure that can be easily handled and has excellent durability. As a result, a high-performance optical laminate body can be obtained.

Such a combination of materials may be achieved by properly selecting the transparent resins exemplified above as resins that constitute each material. To be more specific, it is preferable to use, as the transparent resin that constitutes the concavo-convex structure layer, an ultraviolet curable resin such as an acrylate, whereas it is preferable to use, as the transparent resin that constitutes the substrate, a film made of an alicyclic olefin polymer (e.g., ZEONOR film produced by ZEON Corporation), or a polyester film.

When an optical laminate body having a concavo-convex structure layer is formed, the difference of the refractive indices between the concavo-convex structure layer and a substrate may be as small as possible. In this case, the difference of the refractive indices between the concavo-convex structure layer and the substrate is preferably within 0.1, and more preferably within 0.05.

If necessary, the resin composition may contain an optional component. Examples of the optional component may include an additive such as: an antidegradant such as a phenolic antidegradant and an amine antidegradant; an antistatic agent such as a surfactant antistatic agent and a siloxane antistatic agent; and a light resistance agent such as a triazole light resistance agent and a 2-hydroxy benzophenone light resistance agent.

The thickness of the concavo-convex structure layer is not particularly limited, and preferably 1 µm to 70 µm. The thickness of the concavo-convex structure layer is a distance between a surface on the substrate side of the concavo-convex structure layer on which the concavo-convex structure is not formed, and the flat portion of the concavo-convex structure. The concavo-convex structure layer may be formed by, e.g., preparing a mold such as a metal mold having a desired shape, and transferring the shape of the mold into a layer of a material that forms the concavo-convex structure layer.

Furthermore, in addition to the concavo-convex structure layer, a light diffusion layer, an ultraviolet absorption layer, or the like may also be formed.

The light diffusion layer may be realized by blending a material having light diffusibility with a constituent material. The light diffusion layer is capable of diffusing light passing therethrough and changing a light path to make a light path length longer, to improve light extraction efficiency.

Examples of a material having light diffusibility may include a material containing particles, an alloy resin formed by mixing two or more types of resins to diffuse light. In particular, in view of easily adjusting the light diffusibility, a material containing particles is preferably used, and a resin composition containing particles is more preferably used.

The shape of the particles may be, e.g., a spherical shape, a cylindrical shape, a cubical shape, a rectangular shape, a pyramid shape, a conical shape, and a star shape. A particle diameter is preferably 0.1 µm or larger, and is preferably 10 m or smaller, and more preferably 5 µm or smaller. The particle diameter is a 50% particle diameter in the cumulative size distribution indicating integrated particle amount on a basis of volume with the particle diameter being taken on an axis of abscissa. The larger the particle diameter is, the higher the content ratio of the particles necessary for obtaining desired effects becomes, and the smaller the particle diameter is, the lower the necessary content ratio becomes. When the shape of a particle is not spherical, a diameter of a sphere having a volume equivalent to the volume of the particle is adopted as the particle diameter.

When the particles are transparent particles and the particles are contained in a transparent resin, the differences between the refractive index of the particle and the refractive index of the transparent resin is preferably 0.05 to 0.5, and more preferably 0.07 to 0.5. The refractive index of the particles may be larger than the refractive index of the transparent resin. Alternatively, the refractive index of the transparent resin may be larger than the refractive index of the particles. When the respective refractive indices of the particle and the transparent resin are too close, the diffusion effect may not be obtained and the desired effects may not be obtained, whereas when the difference is excessively large, the diffusion may become excessively large and a loss may occur.

The content ratio of particles is preferably 1% or more, and more preferably 5% or more, and is preferably 80% or less, and more preferably 50% or less, as a volume ratio with respect to the total quantity of the layer containing particles. When the content ratio of particles is equal to or larger than the lower limit, desired effects such as the diffusion effect can be obtained. When the content ratio of particles is equal to or smaller than the upper limit, aggregation of the particles can be prevented, and the particles can be stably dispersed.

As the surface light source device uses organic materials, the organic materials may be prone to be easily deteriorated due to ultraviolet radiation, such as sunlight. Accordingly, it is also effective to form an ultraviolet absorption layer containing an ultraviolet ray absorbent. As the ultraviolet ray absorbent, an organic material may be used, and an inorganic material may also be used. Examples of the ultraviolet ray absorbent belonging to organic materials may include an ultraviolet ray absorbent such as a benzophenone-based absorbent, a benzotriazol-based absorbent, a triazine-based absorbent, and a phenyl salicylate-based absorbent. Preferable examples among them may include 2,4-dihydroxy-benzophenone, 2-hydroxy-4-methoxybenzophenone, 4-decyloxy-2-hydroxybenzophenone, 2-hydroxy-4-methoxy-5- sulfobenzophenone, 2-(2'-hydroxy-5-methylphenyl) benzotriazol, 2-(2'-hydroxy-3',5'-di-tert-butylphenyl) benzotriazol, 2,4-bis[2-hydroxy-4-butoxyphenyl]-6-(2,4-dibutoxyphenyl)-1,3,5-triazine, phenyl salicylate, p-octylphenyl salicylate, and p-tertiarybutylphenyl salicylate. Furthermore, examples of the ultraviolet ray absorbent composed of the inorganic material may include titanium dioxide, zinc oxide, and cerium oxide. In particular, it is preferable to use the inorganic material.

As the ultraviolet ray absorbent, a wavelength conversion material capable of absorbing an ultraviolet ray and wavelength-converting the light into a light having a wavelength longer than that of the absorbed ultraviolet ray may also be used. Examples of the light into which the absorbed ultraviolet ray is wavelength-converted may include a visible light, a near-infrared light, and an infrared light, and a wavelength conversion material capable of wavelength-converting into the visible light is preferable. Examples of the wavelength conversion material may include a fluorescent substance. The fluorescent substance is a material that is usually capable of absorbing an excitation light to emit fluorescence having a wavelength longer than that of the excitation light. Accordingly, when the fluorescent substance is used as the ultraviolet ray absorbent, a fluorescent substance capable of absorbing an ultraviolet ray as an excitation light and capable of emitting fluorescence having a wavelength available for electronic charge generation in an active layer may be used. Examples of an organic fluorescent substance among the fluorescent substances may include a rare earth complex. The rare earth complex is a fluorescent substance having excellent fluorescence property. Specific examples thereof may include a $[Tb(bpy)_2]Cl_3$ complex, an $[Eu(phen)_2]Cl_3$ complex, and a $[Tb(terpy)_2]Cl_3$ complex. [bpy] represents 2,2-bipyridine, [phen] represents 1,10-phenanthroline, and [terpy] represents 2,2':6',2"-terpyridine. Furthermore, examples of an inorganic fluorescent substance may include $MgF_2:Eu^{2+}$ (absorption wavelength of 300 nm to 400 nm, fluorescence wavelength of 400 nm to 550 nm), 1.29 $(Ba,Ca)O.6Al_2O_3:Eu^{2+}$ (absorption wavelength of 200 nm to 400 nm, fluorescence wavelength of 400 nm to 600 nm), $BaAl_2O_4:Eu^{2+}$ (absorption wavelength of 200 nm to 400 nm, fluorescence wavelength of 400 nm to 600 nm), and $Y_3Al_5O_{12}:Ce^{3+}$ (absorption wavelength of 250 nm to 450 nm, fluorescence wavelength of 500 nm to 700 nm). Among the fluorescent substances, it is preferable to use the inorganic fluorescent substance.

As the ultraviolet ray absorbent, one type thereof may be used, and two or more types thereof may also be used. The ultraviolet absorption layer may contain a binder for retaining the ultraviolet ray absorbent. As the binder, it is preferable to use a material capable of retaining the ultraviolet ray absorbent in the ultraviolet absorption layer without significantly impairing the effect of the present invention, and a resin is usually used. Examples of the resin capable of being used as a binder may include a polyester resin, an epoxy resin, an acrylate resin, and a fluorine resin. As the binder, one type of them may be solely used, and two or more types of them may also be used in combination at any ratio. The thickness of the ultraviolet absorption layer is usually 1 µm or more, preferably 10 µm or more, and more preferably 100 µm or more, and is usually 10,000 µm or less, preferably 5,000 µm or less, and more preferably 3,000 µm or less. The position at which the ultraviolet absorption layer is formed has no specific restriction.

<Surface Light Source Device>

The surface light source device according to the present invention includes a surface light-emitting body having a glass-made light-emitting surface member, and the aforementioned optical laminate body, and the aforementioned adhesive layer is attached on the light-emitting surface member. As the surface light-emitting body, a surface light-emitting body including an organic EL element may be used. Because the adhesive layer that constitutes the aforementioned laminate body has high transparency, by using transparent electrodes in the organic EL element, the adhesive layer may be preferably used in a see-through-type surface light source device through which the opposite side of the surface light-emitting body can be observed.

The refractive index n1 of the glass that constitutes the light-emitting surface member is usually 1.50 or more, preferably 1.51 or more, and more preferably 1.53 or more, and is 2.00 or less. The refractive index of the glass n1, the refractive index of the adhesive layer n2, and the refractive index of the substrate n3 satisfy a relationship n3≥n2≥n1. Furthermore, the difference between the refractive index n3 of the substrate and the refractive index n2 of the adhesive layer (n3−n2) is 0.05 or less, and preferably 0.01 or less. When the difference between the refractive indices is within the aforementioned range, light extraction efficiency can be further improved.

The method for producing the surface light source device is not particularly limited. For example, on the glass-made light-emitting surface member of the organic EL light-emitting body, the substrate on which the adhesive layer is formed is attached, and optionally layers such as a concavo-convex structure layer may be appropriately attached, to thereby achieve production.

EXAMPLES

The present invention will be explained more specifically referring to Examples. However, the present invention is not limited to the following Examples. In the examples, "parts" and "%" mean ratio on the basis of weight.

Firstly, a variety of types of acrylic resins were prepared as follows. The weight average molecular weight, the degree of dispersion, and the glass transition temperature of the acrylic resin were measured in accordance with the aforementioned methods. The viscosity of the acrylic resin was measured in accordance with "Rotational viscometer method" specified in JIS K5400 (1990), Section 4.5.3.

Preparative Example 1

<Production of acrylic resin (A-1)>

In a reactor equipped with a thermometer, a stirrer, a dropping funnel, and a reflux condenser, 28 parts of methyl ethyl ketone and 8 parts of toluene were charged, and heated with stirring. After the temperature reached 90° C., a mixture in which 0.16 part of azobisisobutyronitrile (AIBN) was dissolved as a polymerization initiator in 70 parts of phenoxy ethyl acrylate (a1), 15 parts of 2-hydroxyethyl acrylate (a2), and of 15 parts of butyl acrylate (a3) was added dropwise into the reaction over 2 hours. The polymerization was further continued for 7 hours while, during polymerization, a polymerization catalyst solution in which 0.06 part of the AIBN was dissolved in 2 parts of ethyl acetate was successively added. Consequently, an acrylic resin (A-1) solution (solid concentration of 65.0%, viscosity of 1,100 mPa·s (25° C.), weight average molecular weight of 108,200, number average molecular weight of 41,700, degree of dispersion of 2.59, glass-transition temperature of −26.6° C.) was obtained.

Preparative Example 2

<Production of Acrylic Resin (A-2)>

In a reactor equipped with a thermometer, a stirrer, a dropping funnel, and a reflux condenser, 28 parts of methyl ethyl ketone and 8 parts of toluene were charged, and heated with stirring. After the temperature reached 90° C., a mixture in which 0.16 part of azobisisobutyronitrile (AIBN) was dissolved as a polymerization initiator in 70 parts of phenoxy ethyl acrylate (a1), 28 parts of 2-hydroxyethyl acrylate (a2), and 2 parts of butyl acrylate (a3) was added dropwise into the reaction over 2 hours. The polymerization was further continued for 7 hours while, during polymerization, a polymerization catalyst solution in which 0.06 part of the AIBN was dissolved in 2 parts of ethyl acetate was successively added. Consequently, an acrylic resin (A-2) solution (solid concentration of 65.1%, viscosity 2,500 mPa·s (25° C.), weight average molecular weight of 126,000, number average molecular weight of 48,000, degree of dispersion of 2.63, glass-transition temperature of −20.8° C.) was obtained.

Preparative Example 3

<Production of Acrylic Resin (A-3)>

In a reactor equipped with a thermometer, a stirrer, a dropping funnel, and a reflux condenser, 28 parts of methyl ethyl ketone and 8 parts of toluene were charged, and heated with stirring. After the temperature reached 90° C., a mixture in which 0.16 part of azobisisobutyronitrile (AIBN) was dissolved as a polymerization initiator in 70 parts of benzyl acrylate (a1), 15 parts of 2-hydroxyethyl acrylate (a2), and 15 parts of butyl acrylate (a3) was added dropwise into the reaction over 2 hours. The polymerization was further continued for 7 hours while, during polymerization, a polymerization catalyst solution in which 0.06 part of the AIBN was dissolved in 2 parts of ethyl acetate was successively added. Consequently, an acrylic resin (A-3) solution (solid concentration of 65.1%, viscosity of 1,300 mPa·s (25° C.), weight average molecular weight of 105,000, number average molecular weight of 36,000, degree of dispersion of 2.92, glass-transition-temperature of −8.3° C.) was obtained.

Preparative Example 4

<Production of Acrylic Resin (A-4)>

In a reactor equipped with a thermometer, a stirrer, a dropping funnel, and a reflux condenser, 28 parts of methyl ethyl ketone and 8 parts of toluene were charged, and heated with stirring. After the temperature reached 90° C., a mixture in which 0.16 part of azobisisobutyronitrile (AIBN) was dissolved as a polymerization initiator in 70 parts of phenoxy ethyl acrylate (a1), 15 parts of 2-hydroxyethyl acrylate (a2), 14.8 parts of butyl acrylate (a3), and 0.2 part of acrylate (a) was added dropwise into the reaction over 2 hours. The polymerization was further continued for 7 hours while, during polymerization, a polymerization catalyst solution in which 0.06 part of the AIBN was dissolved in 2 parts of ethyl acetate was successively added. Consequently, an acrylic resin (A-4) solution (solid concentration of 65%, viscosity 3,000 mPa·s (25° C.), weight average molecular weight of 99,500, number average molecular weight of 36,800, degree of dispersion of 2.70, glass-transition temperature of −26.4° C.) was obtained.

The compatibility of each of the acrylic resin solutions produced in Preparative Examples 1 to 4 described above was evaluated as follows. Titanium oxide slurry ("780T" produced by TAYCA CORPORATION, ethyl acetate solution) was blended into an acrylic resin solution so that the solid content weight ratio of the titanium oxide slurry with respect to the acrylic resin solution is adjusted to 100/50 (that is, titanium oxide solid content/acrylic resin solid content=100/50), and the state of the titanium oxide in a blended liquid was inspected, and evaluated as follows.

(Evaluation Criteria)

A: dissolved immediately after being blended, and the dissolved state was kept even at a time point of lapse of 10 days of leaving the acrylic resin solution at a room temperature.

B: dissolved once after being blended, and the dissolved state was ceased (separated, gelated) within 10 days of leaving the acrylic resin solution at a room temperature.

C: not dissolved (gelated).

Furthermore, 0.3 part of a 55% ethyl acetate solution of a tolylene diisocyanate adduct of trimethylolpropane ("CORONATE L-55E" produced by Nippon Polyurethane Industry Co., Ltd.) was blended into 100 parts (solid content equivalent) of each acrylic resin solution of Preparative Examples 1 to 4 described above to prepare an adhesive composition. The adhesive composition was applied onto a polyester-based release sheet so that the film thickness after being dried became 40 µm, and dried for 4 minutes at 100° C. to form an adhesive layer. Accordingly, a two-layer multilayer body having a layer structure of (release sheet)/(adhesive layer) was obtained. Thereafter, a polyester-based release sheet was attached to the surface on the adhesive layer side of the multilayer body to obtain a three-layer multilayer body having a layer structure of (release sheet)/(adhesive layer)/(release sheet). The three-layer multilayer body was aged for 10 days under the condition of 40° C. to obtain a double-side adhesive sheet. The refractive index of the double-side adhesive sheet was measured and evaluated in accordance with each of the following methods. The refractive index of the adhesive layer of the double-side adhesive sheet prepared as above was measured with an Abbe refractometer under the condition of 25° C. atmosphere.

Subsequently, one of the release sheets was peeled from the adhesive layer of the aforementioned double-side adhesive sheet to form a two-layer multilayer body having a layer structure of (release sheet)/(adhesive layer). The surface on the adhesive-layer side of the multilayer body was brought into contact with a 100-µm thick polyethylene terephthalate (PET) film (refractive index n3=1.65) with application of pressure. Accordingly, a PET film with an adhesive layer having a layer structure of (release sheet)/(adhesive layer)/(PET film) was obtained. The PET film with the adhesive layer was cut to form a 25 mm-wide 100 mm-long piece, and the release sheet was peeled therefrom. Then the adhesive layer side thereof was attached to a soda glass-made glass plate (0.7 mm in thickness, refractive index of 1.53) with application of pressure using a 2-kg rubber roller that was moved in a two-time reciprocation in 23° C., 50% relative-humidity atmosphere. The resultant was then left for 30 minutes in the same atmosphere. Thereafter, a 1800 peel strength (N/25 mm) was measured at a peeling rate of 300 mm/min at an ordinary temperature.

The results of the measurements are shown in Table 1.

TABLE 1

| | Acrylic resin (A) | | | | | | Refractive index Measured value | Adhesive force N/25 mm | Light extraction efficiency |
|---|---|---|---|---|---|---|---|---|---|
| | Aromatic ring-containing monomer (a1) | Hydroxy group-containing monomer (a2) | (Meth)acrylic acid alkyl ester-based monomer (a3) | Another copolymerizable monomer (a4) | Weight average molecular weight | Compatibility | | | |
| | PEA | BzA | HEA | BA | Aac | | | | | |
| Prep. Ex. 1 | 70 | — | 15 | 15 | — | 108200 | A | 1.529 | 17.3 | 1.003 |
| Prep. Ex. 2 | 70 | — | 28 | 2 | — | 126000 | A | 1.529 | 20.3 | 1.003 |
| Prep. Ex. 3 | — | 70 | 15 | 15 | — | 105000 | A | 1.541 | 18.5 | 1.003 |
| Prep. Ex. 4 | 70 | — | 15 | 14.8 | 0.2 | 99500 | A | 1.529 | 18.1 | 1.003 |
| Comp. Ex. 1 | | | X-311033S | | | 400000 | A | 1.48 | 7.3 | 1.000 |

*PEA: phenoxy ethyl acrylate, BzA: benzyl acrylate, HEA: 2-hydroxyethyl acrylate, BA: butyl acrylate, and Aac: acrylic acid.

Examples 1 to 4

From the PET film with the adhesive layer obtained by using each of the respective acrylic resins (A-1), (A-2), (A-3), and (A-4) obtained in Preparative Examples 1 to 4, the release sheet was peeled to form a multilayer body (optical laminate body) having a layer structure of (adhesive layer)/(PET film). The surface on the adhesive layer side of the multilayer body was attached to a glass substrate plate (refractive index n1=1.53) for forming a surface light-emitting body, to obtain each of laminate bodies 01 to 04.

In Example 1 (Example using (A-1)), the refractive index n1 of the glass, the refractive index n2 of the adhesive layer, and the refractive index n3 of the PET film (substrate) were n3=1.65, n2=1.53, and n1=1.53, respectively, which satisfied a relationship of n3≥n2≥n1.

Comparative Example 1

0.5 part of a 55% ethyl acetate solution of a tolylene diisocyanate adduct of trimethylolpropane ("CORONATE L-55E" produced by Nippon Polyurethane Industry Co., Ltd.) was blended into 100 parts of an acrylic resin of an acrylic adhesive agent (product name "X-311033S", produced by SAIDEN CHEMICAL INDUSTRY Co., Ltd., solid content of 35%) to form an adhesive composition. The compatibility of the adhesive composition was evaluated in the same manner as the evaluation of the composition in Preparative Examples 1 to 4. The results are shown in Table 1.

The adhesive composition was applied onto a polyester-based release sheet so that the thickness after being dried became 40 μm, and dried at 80° C. for 5 minutes to form an adhesive layer. Accordingly, a two-layer multilayer body having a layer structure of (release sheet)/(adhesive layer) was obtained. Thereafter, a polyester-based release sheet was attached to the surface on the adhesive layer side of the multilayer body to obtain a three-layer multilayer body having a layer structure of (release sheet)/(adhesive layer)/(release sheet). The three-layer multilayer body was aged for 10 days under the condition of 40° C. to obtain a double-side adhesive sheet. The refractive index n of the adhesive layer of the adhesive sheet was measured, and found out to be n=1.48. Furthermore, the peel strength of the adhesive layer was evaluated in the same manner as the evaluation of the adhesive layer obtained in the composition of Preparative Examples 1 to 4. The results are shown in Table 1.

Subsequently, one of the release sheets was peeled from the adhesive layer of the aforementioned double-side adhesive sheet to form a two-layer multilayer body having a layer structure of (release sheet)/(adhesive layer). The surface on the adhesive layer side of the multilayer body was brought into contact with a 100-μm thick polyethylene terephthalate (PET) film with application of pressure. Accordingly, a PET film with an adhesive layer having a layer structure of (release sheet)/(adhesive layer)/(PET film) was obtained. From the obtained PET film with the adhesive layer, the release sheet was peeled to form a multilayer body (optical laminate body) having a layer structure of (adhesive layer)/(PET film). The surface on the adhesive layer side of the multilayer body was attached to the glass substrate plate (n1=1.53) for forming a surface light-emitting body, to obtain a laminate body 05. The refractive index n1 of the glass, the refractive index n2 of the adhesive layer, and the refractive index n3 of the PET film (substrate) were n1=1.63, n2=1.48, and n3=1.53, respectively. Therefore, they had a relationship of n3≥n1≥n2, which does not satisfy a relationship of n3≥n2≥n1.

[Evaluation by Simulation]

As to the models of each of the surface light source devices 01 to 05 provided with the respective laminate bodies 01 to 05 obtained in Examples 1 to 4 and Comparative Example 1, optical simulation was performed using a program (program name: ASAP, produced by Breault Research Organization, Inc.) to calculate an amount of light extraction.

The conditions for simulation were as follows.

The laminate structure modeled was composed of a film (100 μm in thickness), an adhesive layer (10 μm in thickness), a glass substrate plate (0.7 mm in thickness, refractive index of 1.63), a transparent electrode (100 nm in thickness, refractive index of 1.9), a light-emitting layer (20 nm in thickness, refractive index of 1.7), a reflective electrode (100 nm in thickness, refractive index of 1.5, 85% reflectance), and a sealing substrate plate (0.7 mm in thickness, refractive index of 1.52) in this order from the light-exiting surface side of the device.

The refractive indices of the film and the adhesive layer were set in accordance with each of Examples and Comparative Example. The surface of the transparent electrode on the light-exiting surface side of the surface light source device was placed as a light-emitting surface, and the luminous intensity on the light-emitting surface was set to 1 lumen.

The amount of light extraction of the surface light source device obtained in Comparative Example 1 was defined as 1. The comparison thereof with an amount of light extraction of the surface light source device in each example was calculated as light extraction efficiency. The results obtained are shown in Table 1. Larger value of this result is indicative of higher light extraction efficiency.

Example 5

(5-1. Acrylic Adhesive Composition)

100 parts (solid content equivalent) of the acrylic resin (A-1) solution that was obtained in Preparative Example 1, 122 parts (solid content equivalent) of a zirconium oxide particle dispersion (NANON5 ZR-010 produced by SOLAR Co., Ltd., volume average particle diameter of 15 nm) as inorganic particles, 14 parts of a plasticizer ("BENZOFLEX 9-88SG" produced by Eastman Chemical Company, melting point of −30° C.), and 8.47 parts of light diffusion particles (silicone particles whose volume average particle diameter is 0.7 μm, product name "XC-99" produced by Momentive Performance Materials Inc.) were mixed and stirred for 15 minutes to obtain an acrylic adhesive composition. The compatibility of the composition obtained was visually inspected. The compatibility was excellent without any problems (separation and gelation were not observed).

(5-2. Optical Laminate Body)

0.5 part of a 55% ethyl acetate solution of a tolylene diisocyanate adduct of trimethylolpropane ("CORONATE L-55E" produced by Nippon Polyurethane Industry Co., Ltd.) was blended into 100 parts of the acrylic resin of the obtained acrylic adhesive composition to prepare a mixture. The mixture was applied onto one surface of a 100-μm thick polyethylene terephthalate film (product name "U34" produced by Toray Industries, Inc.) as a substrate so that the layer thickness after being dried became 40 μm, and dried at 80° C. for 5 minutes to form an adhesive layer. Accordingly, a two-layer multilayer body having a layer structure of (adhesive layer)/(substrate) was obtained. Thereafter, a polyester-based release sheet was attached to the surface on the adhesive layer side of the multilayer body to obtain a three-layer multilayer body having a layer structure of (release sheet)/(adhesive layer)/(substrate). The three-layer multilayer body was aged for 10 days under the condition of 40° C. to obtain an optical laminate body having an adhesive layer and a substrate.

(5-3. Measurement of Adhesive Force (Peel Strength))

The optical laminate body obtained in (5-2) was cut to form a 25 mm-wide 100 mm-long piece, and the release sheet was peeled therefrom. Then the piece was attached to a glass plate using a roller to obtain a multilayer body having a layer structure of (substrate)/(adhesive layer)/(glass plate). After the lapse of 24 hours from the time point of the attachment, the substrate was peeled from the glass plate using a peel tester under the conditions of speed of 20 mm/min and 90° C. to measure peel strength in the length direction. The result is shown in Table 2.

(5-4. Measurement of Refractive Index)

The acrylic adhesive composition obtained in (5-1) was applied onto one surface of a glass plate so that the layer thickness after being dried became 20 μm, and dried at 80° C. for 5 minutes to form an adhesive layer for measurement of the refractive index. The refractive index of the adhesive layer was measured using the ellipsometer (M-2000 produced by J. A. Woollam Co., Inc.). The result is shown in Table 2.

Example 6

An optical laminate body was obtained and evaluated in the same manner as in Example 5 except that the acrylic resin (A-1) solution was substituted with the acrylic resin (A-2) solution. The results are shown in Table 2.

Example 7

An optical laminate body was obtained and evaluated in the same manner as in Example 5 except that the acrylic resin (A-1) solution was substituted with the acrylic resin (A-3) solution. The results are shown in Table 2.

Example 8

An optical laminate body was obtained and evaluated in the same manner as in Example 5 except that the acrylic resin (A-1) solution was substituted with the acrylic resin (A-4) solution. The results are shown in Table 2.

TABLE 2

|  |  |  | Ex. 5 | Ex. 6 | Ex. 7 | Ex. 8 | Comp. Ex. 1 |
|---|---|---|---|---|---|---|---|
| Acrylic resin | Aromatic ring-containing monomer (a1) | PEA | 70 | 70 | — | 70 | X-311033S |
|  |  | BzA | — | — | 70 | — |  |
|  | Hydroxy group-containing monomer (a2) | HEA | 15 | 28 | 15 | 15 |  |
|  | (Meth)acrylic acid alkyl ester-based monomer (a3) | BA | 15 | 2 | 15 | 14.8 |  |
|  | Another copolymerizable monomer (a4) | Aac | — | — | — | 0.2 |  |
|  | Weight average molecular weight |  | 108200 | 126000 | 105000 | 99500 | 400000 |
| Glass | Refractive index |  | 1.64 | 1.64 | 1.64 | 1.64 | 1.64 |
| Inorganic particles | Adding amount |  | 122 parts | 122 parts | 100 parts | 122 parts | — |
|  | Compatibility with resin |  | Excellent | Excellent | Excellent | Excellent | — |
| Plasticizer | Adding amount |  | 14 parts | 14 parts | 14 parts | 14 parts | — |
| Light diffusion particles | Type |  | Silicone particles | Silicone particles | Silicone particles | Silicone particles | — |
|  | Refractive index |  | 1.43 | 1.43 | 1.43 | 1.43 | — |
|  | Volume average particle diameter (μm) |  | 0.7 | 0.7 | 0.7 | 0.7 | — |
| Substrate (refractive index) |  |  | PET(1.65) | PET(1.65) | PET(1.65) | PET(1.65) | PET(1.65) |
| Refractive index of adhesive agent |  |  | 1.64 | 1.64 | 1.64 | 1.64 | 1.48 |
| Adhesive force |  |  | 7.3 | 8.2 | 7.8 | 7.1 | 7.3 |
| Light extraction efficiency |  |  | 1.134 | 1.134 | 1.134 | 1.134 | 1.000 |

In Examples 5 to 8, the multilayer body was attached to the glass substrate plate (refractive index n1=1.64) for forming a surface light-emitting body, to obtain the laminate bodies 05 to 08. The refractive index n1 of the glass, the refractive index n2 of the adhesive layer, and the refractive index n3 of the PET film (substrate) satisfied the relationship $n3=1.65 \geq n2=1.64 \geq n1=1.64$.

The optical laminate body obtained in each of Examples 5 to 8 was evaluated in the same manner as the evaluation for the optical laminate body obtained in each of Examples 1 to 4 in the aforementioned [Evaluation by simulation], to calculate amounts of light extraction. The amount of light extraction thus calculated was compared with the amount of light extraction obtained in Comparative Example 1 to obtain light extraction efficiency. The results are shown in Table 2.

The invention claimed is:

1. An optical laminate body comprising: a substrate; and an adhesive layer formed on the substrate, wherein
the optical laminate body is used such that a surface thereof on the adhesive layer side is attached to a glass-made light-emitting surface member,
a relationship n3≥n2≥n1 is satisfied where n1 is a refractive index of the glass that constitutes the light-emitting surface member, n2 is a refractive index of the adhesive layer, and n3 is a refractive index of the substrate,
the adhesive layer is composed of an acrylic adhesive composition containing an acrylic resin (A), and
the acrylic resin (A) is a copolymer of a copolymerizable component [I] containing 40% by weight to 93% by weight of an aromatic ring-containing monomer (a1), and 7% by weight to 60% by weight of a hydroxy group-containing monomer (a2), the weight average molecular weight of the acrylic resin (A) being 200,000 or less.

2. The optical laminate body according to claim 1, wherein the acrylic adhesive composition contains an inorganic oxide (B).

3. The optical laminate body according to claim 2, wherein the inorganic oxide (B) is particles having a volume average particle diameter of 5 nm to 50 nm, and the acrylic adhesive composition contains 80 to 130 parts by weight of the inorganic oxide (B) with respect to 100 parts by weight of the acrylic resin.

4. The optical laminate body according to claim 1, wherein the acrylic adhesive composition contains a crosslinking agent (C).

5. The optical laminate body according to claim 1, wherein the acrylic adhesive composition contains a plasticizer (D).

6. The optical laminate body according to claim 5, wherein the acrylic adhesive composition contains 5 parts by weight to 20 parts by weight of the plasticizers (D) with respect to 100 parts by weight of the acrylic resin (A).

7. The optical laminate body according to claim 5, wherein the plasticizer (D) has a melting point of 0° C. or lower.

8. The optical laminate body according to claim 5, wherein the plasticizer (D) is selected from the group consisting of ester-based plasticizers.

9. The optical laminate body according to claim 8, wherein the plasticizer (D) is a benzoic acid ester.

10. The optical laminate body according to claim 1, wherein a difference (n3−n2) between the refractive index n3 of the substrate and the refractive index n2 of the adhesive layer is 0.02 or less.

11. The optical laminate body according to claim 1, wherein a difference (n2−n1) between the refractive index n2 of the adhesive layer and the refractive index n1 of the glass is 0.02 or less.

12. The optical laminate body according to claim 1, wherein the refractive index n2 of the adhesive layer is 1.53 or more.

13. The optical laminate body according to claim 1, wherein the optical laminate body further includes a concavo-convex structure layer formed on the substrate.

14. A surface light source device comprising: a surface light-emitting body having a glass-made light-emitting surface member; and the optical laminate body according to claim 1, wherein the adhesive layer is attached to the light-emitting surface member.

\* \* \* \* \*